United States Patent
Vischer

(10) Patent No.: US 6,756,224 B2
(45) Date of Patent: Jun. 29, 2004

(54) DEVICE FOR RECEIVING A CHIP SHAPED CARRIER AND PROCESS FOR ASSEMBLING A PLURALITY OF SUCH DEVICES

(75) Inventor: Peter Vischer, Seeburgstrasse (CH)

(73) Assignee: Roche Molecular Systems, Inc., Alameda, CA (US)

( * ) Notice: Subject to any disclaimer, the term of this patent is extended or adjusted under 35 U.S.C. 154(b) by 40 days.

(21) Appl. No.: 10/205,734

(22) Filed: Jul. 26, 2002

(65) Prior Publication Data

US 2003/0064506 A1 Apr. 3, 2003

(30) Foreign Application Priority Data

Jul. 30, 2001 (EP) .............................................. 01118247

(51) Int. Cl.⁷ ............................................... C12M 1/34
(52) U.S. Cl. ............................... 435/287.2; 435/288.3; 435/288.7; 435/809; 422/102; 422/104; 156/293
(58) Field of Search .......................... 435/287.2, 288.3, 435/288.7, 809; 422/102, 104; 156/293, 294

(56) References Cited

U.S. PATENT DOCUMENTS

| | | | |
|---|---|---|---|
| 3,654,688 A | 4/1972 | Setzler | 29/240 |
| 3,918,146 A | 11/1975 | Hartleroad et al. | 29/569 |
| 5,945,334 A | 8/1999 | Besemer et al. | 435/287 |
| 6,410,309 B1 * | 6/2002 | Barbera-Guillem et al. | 435/297.5 |

FOREIGN PATENT DOCUMENTS

| | | |
|---|---|---|
| DE | 29721359 U1 | 3/1998 |
| EP | 0 420 413 A1 | 4/1991 |
| EP | 0 541 229 A1 | 5/1993 |
| WO | WO 01/02094 | 1/2000 |
| WO | WO 00/66268 | 11/2000 |

* cited by examiner

Primary Examiner—David A. Redding
(74) Attorney, Agent, or Firm—Bart W. Wise

(57) ABSTRACT

A device for receiving a chip shaped carrier having an active surface, e.g. a surface which carries an array of DNA oligonucleids and which is adapted to be read by an electro-optical reading device. The device comprises: a cartridge having an opening for receiving a liquid sample and including casing parts (14, 15); a casing part having an inner surface and outer surface, a first cavity for receiving a chip shaped carrier, and means which provide access to that first cavity and thereby to the active surface of the chip shaped carrier; a sealing material which is at least once reversibly liquidifiable; the shape and dimensions of first cavity, chip shaped carrier, and sealing material, being chosen that the chip shaped carrier fits into the space delimited by the sealing material. The process for mounting the carrier in the cartridge essentially consists in placing the carrier in the first cavity and liquidifying the sealing material. In the liquid state, the sealing material closes any gap between the side walls of the first cavity and the carrier, and after solidification, the sealing material constitutes a strong and liquid-tight bond.

18 Claims, 5 Drawing Sheets

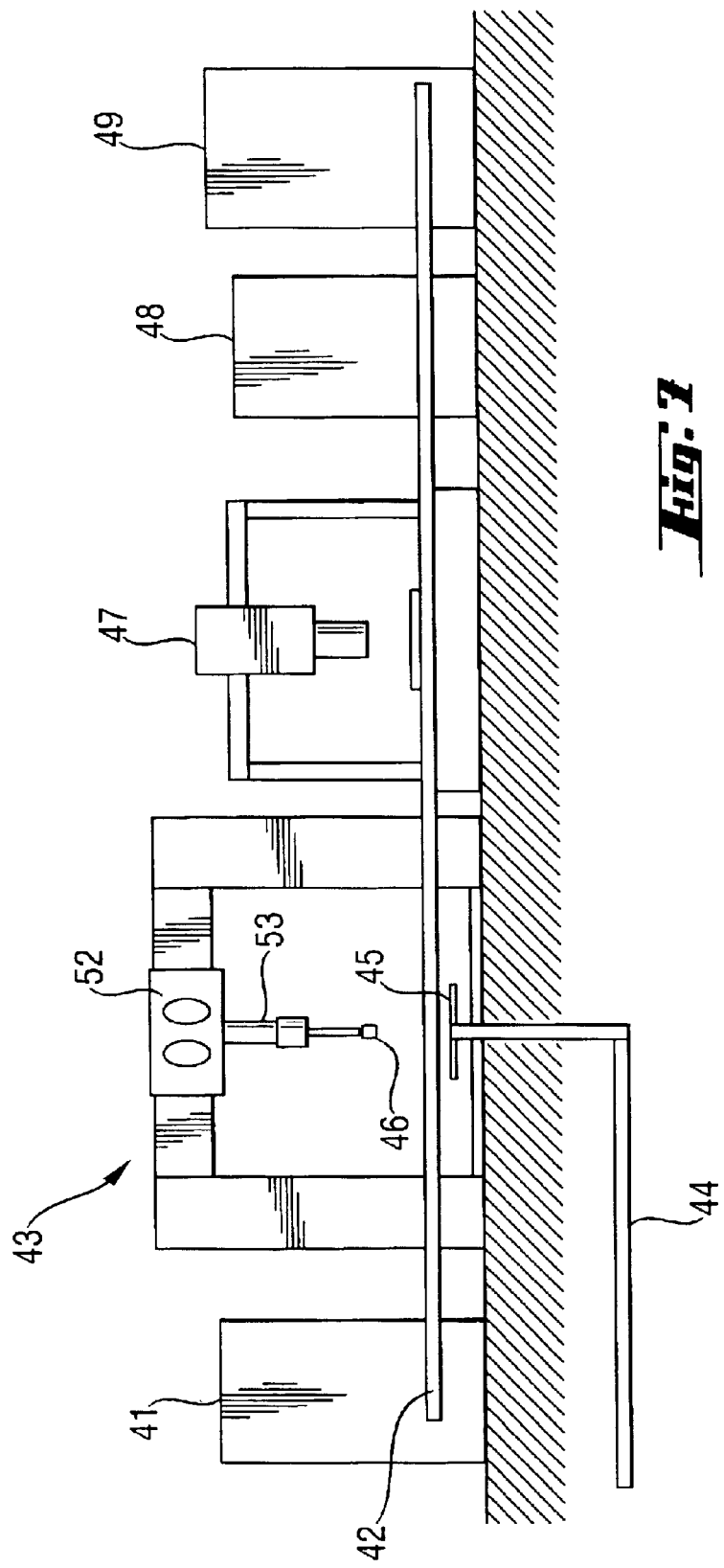

DEVICE FOR RECEIVING A CHIP SHAPED CARRIER AND PROCESS FOR ASSEMBLING A PLURALITY OF SUCH DEVICES

TECHNICAL FIELD

The present invention relates to a device for receiving a chip shaped carrier having on one side a first surface which includes an active surface coated with an array of DNA snippets or the like, a second surface on a second side opposite to said first side, and an edge having a peripheral outer surface which extends between said first and said second surface, said active surface being adapted to be read by an electro-optical reading device.

The invention further relates to an analytical cartridge comprising a chip receiving device.

The invention further relates to a process for assembling a plurality of such chip receiving devices.

The invention further relates to a system for carrying out evaluation and/or monitoring methods involving electro-optical reading of an active surface of a chip shaped carrier.

The invention further relates to a method for positioning and fastening at least one second object in a first object, the first object being provided with a seat for said at least one second object.

BACKGROUND OF THE INVENTION

Within the context of the instant invention a chip shaped carrier is a substrate, in particular a glass chip of e.g. squared shape having a thickness of e.g. 0.7 or 1.0 millimeter and a so called active surface, which is a surface coated with an array of different snippets of DNA, e.g. DNA oligonucleotide probes, located at known positions on that surface. Those snippets of DNA serve as probes for detecting DNA fragments with a complementary DNA sequence.

Within the context of the instant invention a receiving device for receiving such a DNA chip is in particular a one-way cartridge made of a plastic material, and a cartridge hosting a DNA chip is called an analytical cartridge.

DNA chips contained in such cartridges have a wide range of applications. For example, they may be used for studying the structure-activity relationship between different biological materials or determining the DNA-sequence of an unknown biological material. For instance, the DNA-sequence of such unknown material may be determined by, for example, a process known as sequencing by hybridization. In one method of sequencing by hybridization, sequences of diverse materials are formed at known locations on a surface of a chip, and a solution containing one or more targets to be sequenced is applied to that surface. The targets will bind or hybridize with only complementary sequences on the substrate. The locations at which hybridization occurs are detected with appropriate detection systems by labeling the targets with a fluorescent dye, radioactive isotope, enzyme, or other marker. Information about target sequences can be extracted from the data obtained by such detection systems.

By combining various available technologies, such as photolithography and fabrication techniques, substantial progress has been made in the fabrication and placement of diverse materials on chips of the above mentioned kind. For example, thousands of different sequences may be fabricated on a single substrate of about 1.28 square centimeter in only a small fraction of the time required by conventional methods. Such improvements make these substrates practical for use in various applications, such as biomedical research, clinical diagnostics, and other industrial markets, as well as the emerging field of genomics, which focuses on determining the relationship between genetic sequences and human physiology.

As commercialization of such chips becomes widespread, an economically feasible device and a method for receiving the chips with a high-throughput are desired.

Since the active surface of the chip, that is the surface thereof which is coated with the above mentioned diverse sequences, has to be accessible e.g. to optical detection means, e.g. in the case of fluorescence measurements, the chip has to be inserted into a wall of a one-way cartridge with its active surface facing the interior of the so-called process chamber within the cartridge, and with its opposite surface being accessible to the optical detection means.

For instance in the above mentioned method of sequencing by hybridization, processing of the coating on the active surface of the chip includes flooding of the process chamber of the cartridge with a solution containing one or more targets to be sequenced. Therefore, a liquid-tight connection between the chip and the one-way cartridge is necessary. In a known embodiment described in U.S. Pat. No. 5,945,334 this has been achieved under clean-room conditions by attaching the chip to a cavity of the cartridge by means of an adhesive, that is by gluing it into the cartridge. This known method for connecting the chip to the cartridge has serious disadvantages. First, the fluorescence of the adhesives used is so high that it substantially interferes and perturbates fluorescence measurements performed on the active surface of the chips and can even have saturating effect on a photomultiplier used for performing the fluorescence measurements. The adhesive has to be applied by a dispenser, which is not possible with any adhesive. Furthermore, the known adhesives are prone to develop or contain gases, which when freed would disturb the reactions. Another problem is occasioned by solvent present in the adhesive because the solvent may react with the DNA samples on the active surface. It has even be found that solvent negatively influence the properties of the glass surface of a chip shaped carrier, e.g. blurs it.

A further disadvantage of the known method for connecting the chip to the cartridge is that it is performed manually and is not suitable for being performed by automated means, because a very careful positioning within the receiving window of the cartridge is necessary. Furthermore, as the adhesive is applied thereafter, a second control, if the DNA chip is still in place, has to be performed. These operations are aggravated by the relatively large tolerances of the dimensions of the chips and their rather uneven edges.

BRIEF SUMMARY OF THE INVENTION

A first aim of the invention is therefore to provide a device for receiving a chip of the above mentioned kind which avoids at least one of the above-mentioned disadvantages, and preferably all of it.

A second aim of the invention is to provide an analytical cartridge comprising a chip receiving device according to the invention.

A third aim of the invention is to provide a process for assembling a plurality of chip receiving devices according to the invention with a high throughput.

A fourth aim of the invention is to provide a system for carrying out evaluation and/or monitoring methods involving electro-optical reading of an active surface of a chip shaped carrier with avoiding at least one of the above mentioned disadvantages of prior art embodiments.

A fifth aim of the present invention is to provide a method for more conveniently placing a first object in a second object and to fasten it there.

According to the invention the above-mentioned first aim is attained with a device for receiving a chip shaped carrier having on one side a first surface which includes an active surface coated with an array of DNA snippets or the like, a second surface on a second side opposite to said first side, and an edge having a peripheral outer surface which extends between said first and said second surface, said first surface being adapted to be read by an electro-optical reading device, said device comprising (a) a cartridge having an opening for introducing a liquid sample into said cartridge, (b) said cartridge having a casing part which has an outer surface and an inner surface, a first cavity for receiving a chip shaped carrier, (c) a layer of a sealing material which is reversibly transformable at least once from a solid state into a fluid state and which is provided in a sufficient amount to establish a liquid-tight bond between the inner surface of side walls of the first cavity and said peripheral outer surface of the edge of the chip shaped carrier when the latter is placed into said first cavity.

The main advantages of a chip receiving device according to the invention are due to the fact that the required liquid-tight connection of the chip to the cartridge is achieved by means of a solid sealing material which liquidifies when heated over a certain temperature and resolidifies when cooled. In the solid state, the sealing material constitutes a substantial part of the wall of a seat for a chip formed within the cartridge and thereby contributes to define the position of the chip when it is set in the socket. After the chip is positioned in the seat, the sealing material is liquidified by heating it and then fills the space between the solid walls of the seat and the chip. Since this happens when the sealing material is in liquid state, any irregularity of the edges of the chip does not impair the quality of the sealing.

Surprisingly, depending on the nature of the sealing material, the chip remains fluid-tight even if a sensible overpressure is applied, e.g. exerted by a liquid filled in the chamber of the cartridge.

A preferred sealing material is a material which is apt to be molten by applying heat and which resolidifies when cooled. A preferred sealing material is a hotmelt material, particularly a hotmelt adhesive, i.e. an adhesive fusible by heat, also known as "thermoplastic adhesive".

According to the invention the above mentioned second aim is attained with an analytical cartridge which comprises a chip shaped carrier inserted in the first cavity of a chip receiving device according to the invention, wherein the sealing material fills the clearance between the walls of the first cavity and the chip.

According to the invention the above mentioned third aim is attained with a process for assembling a plurality of analytical cartridges according to the invention, which process comprises:

(a) providing a plurality of casing parts to an automated assembly line, (b) providing a plurality of chip shaped carriers having each an active surface to said assembly line, (c) positioning each of said chip shaped carriers within the first cavity of one of said casing parts by means of a first automatic apparatus, (d) bonding each of said chip shaped carriers in said first cavity of said casing part, by liquidifying the sealing material.

The main advantages of a process according to the invention for assembling a plurality of chip receiving devices having the structure proposed by the instant invention are that such a process is adapted to be entirely performed using standard automated means and provides a high throughput.

According to the invention the above mentioned fourth aim is attained with a system for carrying out evaluation and/or monitoring methods involving electro-optical reading of an active surface of a chip shaped carrier, said system comprising (a) a cartridge having an opening for introducing a liquid sample into said cartridge, and a casing part, (a.1) said casing part being comprised in the cartridge and having an inner surface and an outer surface, a first cavity for receiving a chip shaped carrier, and means which provide access to a first cavity and thereby to said active surface of said chip shaped carrier, and (a.2) said first cavity having a flat bottom surface and side wall surfaces which extend between said inner surface of said casing part and said bottom surface (b) a sealing material being provided in said first cavity, said sealing material consisting of an at least once reversibly liquidifiable material, and (c) a chip shaped carrier having an active surface which is adapted to be read by an electro-optical reading device, said chip shaped carrier being positioned in said first cavity of said casing part, and the sealing material filling the gap between the cavity walls, particularly its side walls, and the chip shaped carrier in order to hold the chip shaped carrier firmly and fluid-tightly in the cavity.

The main advantage of a system according to the invention is that it makes possible to carry out evaluation and/or monitoring methods involving electro-optical readings of an active surface of a chip shaped carrier of the above mentioned type and eliminates the above mentioned drawbacks of prior art equipment.

According to the invention the above mentioned fifth aim is attained with a method for positioning and fastening at least one second object in a first object, the first object being provided with a seat for the second objects, said method comprising forming at least part of the walls of the seat, preferably the circumferential rim, from a solid material which is at least once reversibly liquidifiable, preferably a hot melt material, placing the second objects into the seat, and liquidifying the solid liquidifiable material so that the latter material attaches the first object to the second object and after resolidification establishes a bond between the first object and the second object.

According to this more general aspect of the invention, by use of hotmelt material, it is possible to produce solid objects providing seats, frames, cavities or the like, with the intention to place therein one or also more than objects and to readily fasten them therein. For this purpose, the rim of the seat is constituted at least to a sufficient part by a hot melt material. As the hot melt is solid under normal conditions, it is apt to be quite exactly adapted to the geometry of the second object(s), and the latter when placed into the seat, are exactly registered therein. Thereby, an additional control of exact position of the second object may be waived. After placing the second object(s) into the respective seat, the solid hotmelt is locally heated in order to render it liquid and to fasten the second object(s) in their seat.

Particularly advantageous is that the first object and the parts made of hot melt may be manufactured long time before they are used to receive and hold the second object(s). In other words, the hot melt, or more generally, the material which liquidifies when heated over a certain temperature and resolidifies again when cooled, is a solid part which is formed on the first object before it is used to form a bond between the second and the first object and which is molten, e.g. by irradiation using laser light, to behave as a glue and/or a fluid sealing material.

Preferred exemplary embodiments of the invention are described hereinafter more in detail with reference to the accompanying drawings, wherein

BRIEF DESCRIPTION OF DRAWINGS

FIG. 7 shows an assembly line for automatically receiving chips in cartridges.

Figure 1:
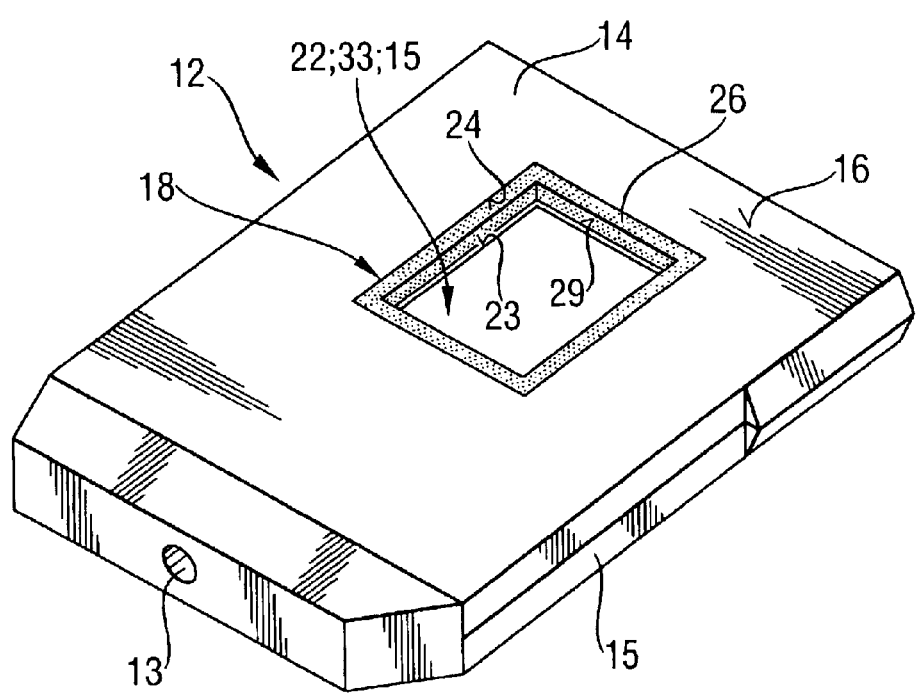
FIG. 1 shows a perspective view of a chip receiving device comprising a cartridge 12.

LIST OF REFERENCE NUMBERS 12 cartridge
13 opening (for introduction of liquid)
14 first casing part
15 second casing part
16 outer surface of casing part 14
17 inner surface of casing part 14
18 first cavity of casing part 14
20 joint clearance
21 chip (shaped carrier)
22 second cavity of casing part 14
23 bottom surface of first cavity 18
24 side wall surfaces of first cavity 18
25 opening in 23
26 hotmelt
28 active surface (part of first surface 61 covered by probe array 32)
29 inner surface of hotmelt 26
30 laser light
31 edge of chip 21
32 probe array on first surface of chip shaped carrier 21
33 processing chamber
41 stock of casing parts 14, 15
42 first conveyor
43 die-bonder
44 second conveyor (blue tapes)
46 die collet on 53
47 laser welding machine
48 automatic packaging apparatus
49 stock of assembled cartridges 12
51 electro-optical reading system
52 working frame of 43
53 tool holder of 43
61 first surface of 21
62 second surface of 21
63 third surface of 21
70 side length of chip 21
71 side length of active surface 28 on chip 21
73 thickness of chip 21

DESCRIPTION OF PREFERRED EMBODIMENTS

As shown by FIG. 1, a chip receiving device according to the invention comprises a cartridge 12. Cartridge 12 comprises a first casing part 14 and a second casing part 15. Casing part 15 has an opening 13 for introducing a liquid sample into cartridge 12. Casing part 15 is preferably made of an optically non-transparent material.

As can be appreciated from FIG. 2, casing part 14 has an outer surface 16 and inner surface 17, a first cavity 18 for receiving a chip shaped carrier 21—called for simplicity chip 21 hereinafter—and a second cavity 22 which forms a window providing access to said first cavity 18 and thereby to the active surface 28 of chip shaped carrier 21. This structure is just one example of means which provide visual access to active surface 28.

Typically, chip 21 is made of glass, has a thickness of 0.7 or 1.0 millimeter, and has substantially the shape of a square. Since the size of chip 21 has a relatively high dimensional tolerance of e.g. 0.0762 millimeter of length and width, in the embodiment described hereinafter the space available in cavity 18 for receiving and positioning chip 21 has a corresponding joint clearance 20 (cf. FIG. 6).

Chip 21 has a first surface 61 a part of which is an active surface 28 which is covered by oligonucleotide probes 32 and which must not be touched at all to avoid any damage of the probes 32.

Chip 21 has a second surface 62 opposite to first surface 61 and an edge having a peripheral surface 63 which extends between the first surface 61 and the opposite surface 62 of chip 21.

Cavity 18 has a flat bottom surface 23 and side wall surfaces 24 which extend between outer surface 16 of casing 14 and bottom surface 23. As shown by FIGS. 2–6, a layer of a solid sealing hotmelt material 26 is arranged on side wall surfaces 24. The solid hotmelt is fusible by heating, specifically by irradiation with laser light, and solidifies again when cooled. In order to facilitate the insertion of the chip 21, the inner surfaces 29 of the hotmelt material layer 26 may be inclined so that an opening tapering to the bottom surface 23 is obtained. For this purpose, the tapering caused by injection molding of this piece may suffice.

The bottom surface 23 has an opening 25 which opens into second cavity 22.

Figure 2:
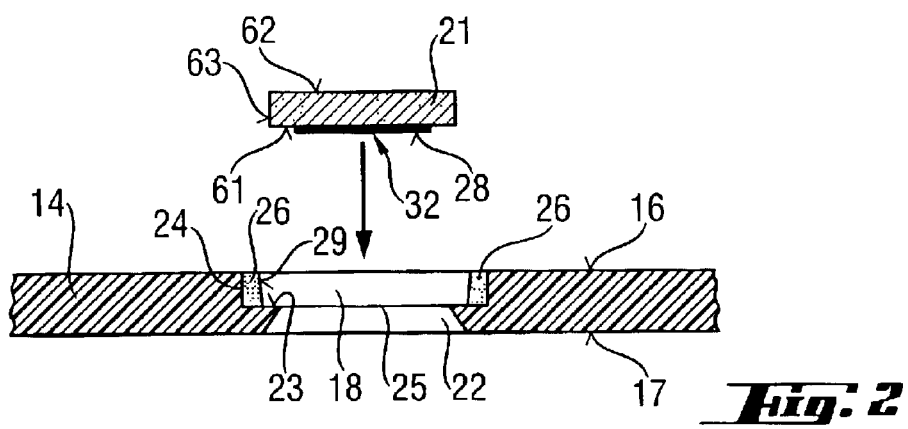
FIG. 2 shows a cross-sectional, exploded view of means used according to the invention for attaching a chip shaped carrier 21 to a first casing 14 which is part of a cartridge 12.
Figure 3:
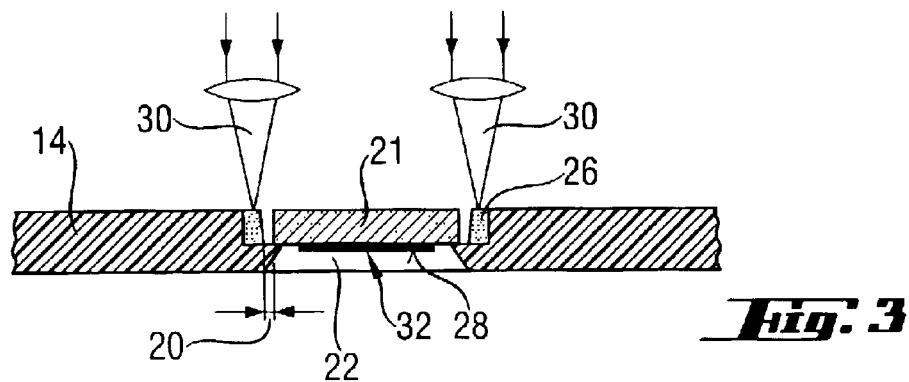
FIG. 3 shows the same as FIG. 2, but with a chip inserted and energy sources.

As can be appreciated from FIGS. 2 and 3, chip 21 is positioned in cavity 18 of casing part 14. The hotmelt 26 is heated by means of laser light 30 provided by a suitable light source. The laser light is directed sequentially to a number of points of hotmelt material layer 26 or simultaneously to the whole hotmelt material layer 26. The heated hotmelt 26 becomes then fluid and fills the clearance 20 between walls 24 and the edge of the chip 21. Obviously, irregularities in the shape of the edge 31 of the chip 21 do not have any sensible influence on this process, neither on the quality of the bond between the hotmelt 26 and the chip 21. Just on the contrary, it can be expected that irregularities ameliorate its mechanical strength.

Further advantages are:

a) there is no mechanical stress involved in establishing the bond between casing 14 and chip 21 in contrast to known devices where the chip is held by clamping means;

b) no adhesive has to be administered after positioning the chip, and the disadvantage of the known adhesives set forth in the introduction are avoided;

c) the chip may be inserted from the outer surface of the housing part 14;

d) solidification of the hotmelt, i.e. the bonding process, is a physical process (phase transition), and quite fast;

e) the hot melt material may preferably be chosen such that it retains permanently a certain elasticity;

f) the hotmelt material does not impair fluorescence measurements, i.e. has low fluorescence activity at 633 nm; and g) increased life time with respect to conventional adhesives.

In one embodiment, the following materials were used:

Chip 21: glass

Hotmelt layer 26: Ecomelt P1 Ex318 (Collano Ebnöther A G, Schweiz): Softening temperature: 90° C. (DIN 52011; ASTM D36/E28); working temperature range: 150–180° C., typically 160° C.;

Casing 14 respectively 15: Topas 6013 (Ticona GmbH, Deutschland): a copolymer of ethylene and nobornene, more generally a cycloolefinic copolymer (COC); shape heat resistance temperature: 130° C.

It was found that the chip was safely held against an overpressure of 500 mbar at 20° C., and no leakage occurred. Even at 60° C., the joint withstood the pressure for some minutes. Failure at 300 mbar overpressure, which regularly occurs in normal operation, is therefore excluded.

Figure 4:
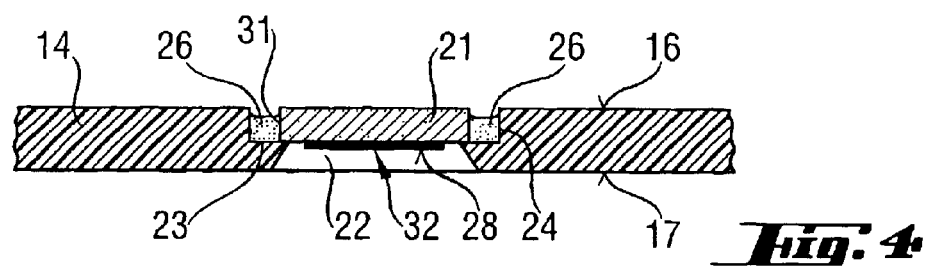
FIG. 4 shows a cross-sectional view of the means represented in FIG. 2 after they have been assembled according to the invention.
Figure 5:
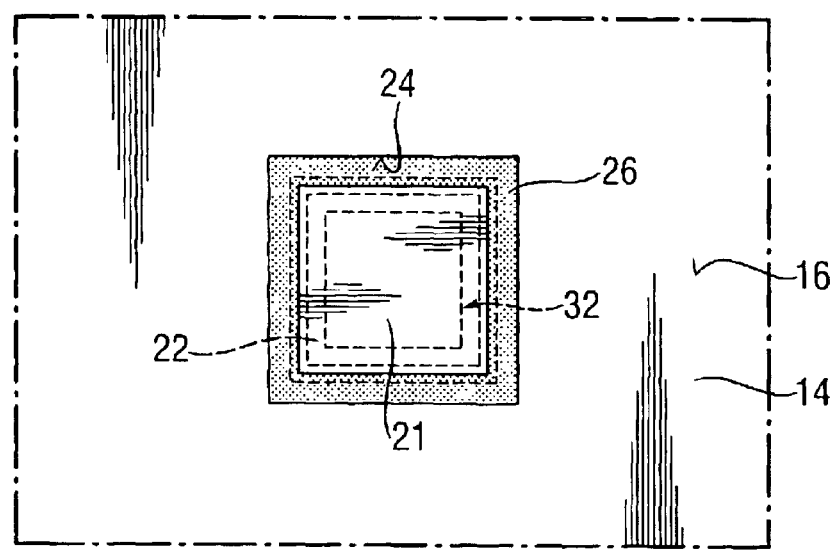
FIG. 5 shows a top view of the assembly represented in FIG. 4.

FIGS. 4 and 5 show the fixed state in a cross-sectional and a top view, respectively. Particularly in FIG. 4, it is evident that the hotmelt 26 has filled up the clearance 20 from the bottom.

As can be appreciated from FIGS. 2 to 5, the shape and dimensions of cavity 18, chip 21, hotmelt layer 26 and opening 25 of bottom surface 23 of cavity 18 are so chosen that the chip 21 fits into the space delimited by the hotmelt layer 26.

Figure 6:
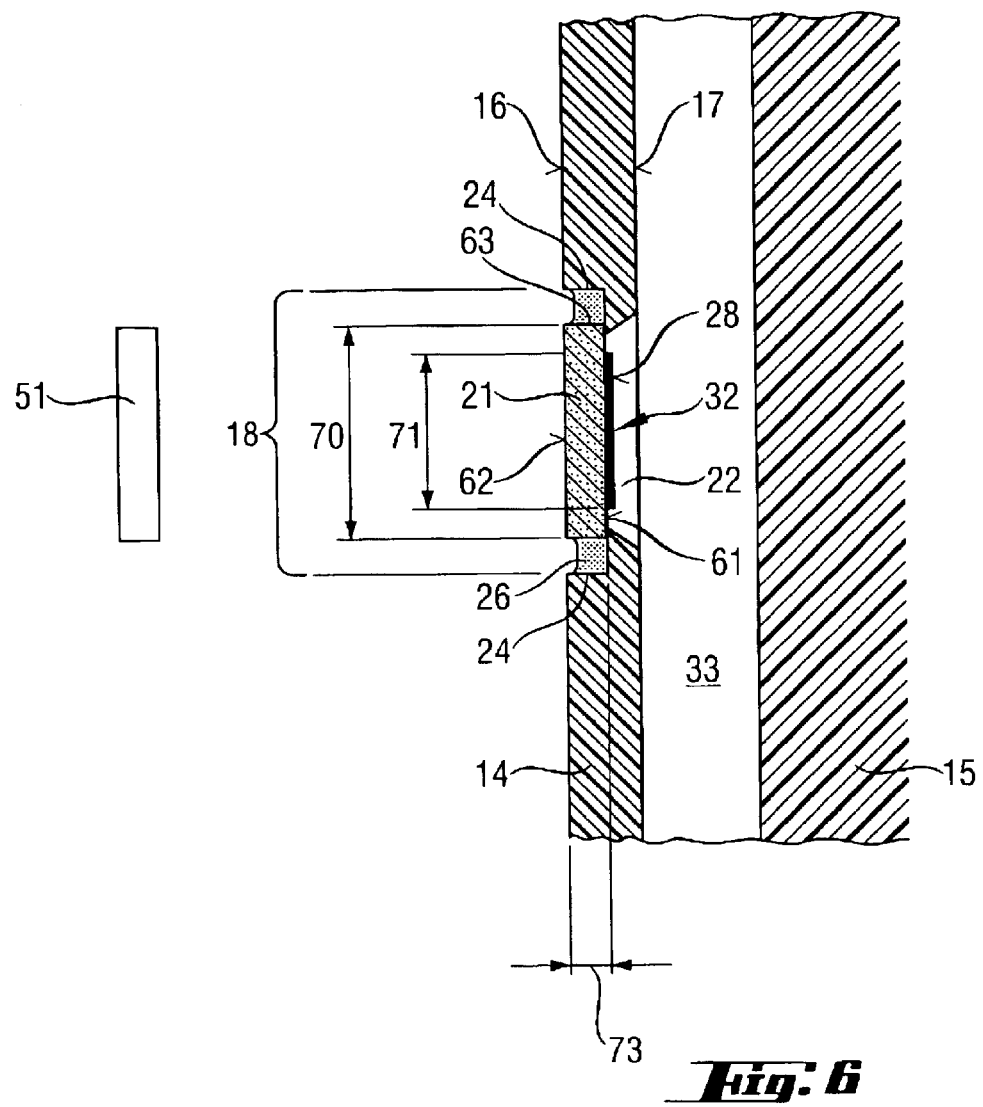
FIG. 6 shows a schematic partial cross-section of a cartridge.

In a preferred embodiment part of which is schematically shown by FIG. 6, chip 21 has a first surface 61 a part of which is an active surface 28 coated with a so called probe array 32, i.e. an array of diverse sequences, e.g. DNA oligonucleotides, located at known positions on that first surface 61, and a second surface 62 opposite to said first surface. A third surface 63 which extends between said first and second surfaces, is normal to these surfaces, and is the outer surface of the lateral periphery or edge of chip 21.

Since the probe array 32 of chip 21 has to be accessible e.g. to optical detection means, e.g. for performing fluorescence measurements, chip 21 is inserted into the outer wall of cartridge 12, and its first surface 61 with the probe array 32 on it faces the interior of a so-called process chamber 33 within cartridge 12.

The geometric specifications of mounting of chip 21 are represented in FIG. 6, with all dimensions are indicated in millimeters. As indicated therein, a chip 21 may usually have three sizes designated by numbers 100, 169 and 400 and is substantially quadratic in shape. Chip size 100 has a side length 70 of 10.92 millimeters. Chip size 169 has a side length 70 of 8.153 millimeters. Chip size 400 has a side length 70 of 5.384 millimeters. The active surface of chip size 100 has a side length 71 of 9.5 millimeters. The active surface of chip 21 size 169 has a side length 71 of 6.73 millimeters. The active surface of chip size 400 has a side length 71 of 3.96 millimeters. Thickness 73 of the chip 21 is about 0.7 mm.

A further aspect of the invention relates to a process for an automated assembly of a plurality of chip receiving devices according to the invention.

FIG. 7 schematically shows the structure of a completely automatic assembly line for carrying out such a process. This assembly line comprises a stock 41 of casing parts 14, 15 of cartridges 12, a first conveyor 42, a die bonder 43, a second conveyor 44 for conveying blue tapes which come from a diamond saw cutting machine and which carry a plurality of chip shaped carriers 21, a laser welding machine 47, an automatic packaging apparatus 48, and a stock of completely assembled chip receiving devices 49. Assembly line components 42 to 48 are all standard apparatuses and devices suitable for automated operation. Die bonder 43 comprises a blue tape support 45 having an expansion mechanism, a working frame 52 movable in x- and y-direction and a tool holder 53 which holds a die collet 46. Tool holder 53 is connected to working frame 52 and is thereby movable in x- and y-direction. Tool holder 53 has a means, e.g. a spindle, which enables to move die collet 46 in z-direction.

According to the invention, a process for assembling a plurality of analytical cartridges comprising cartridges 12 comprises the following steps:

(a) providing to an input side of the automatic assembly line shown by FIG. 7 a plurality of casings 14, each of the casings 14 comprising a hotmelt layer 26 as described above, (b) providing a plurality of chip shaped carriers 21 each of which has an active surface 28 to said assembly line, (c) positioning each of the carriers 21 within the cavity 18 of one of said casing parts 14 by means of automatic die bonder 43, (d) melting the hotmelt layer 26 in the laser welding machine 47 in order to have the liquidified hotmelt material fill the clearance 20 between side walls 24 and the edge 63 of the chip 21.

In the above mentioned process steps (a) and (b), casings 14 are preferably transferred one-by-one via first conveyor 42 from the stock of parts 41 to die bonder 43 and from there successively to the other parts of the assembly line where a processing step has to be carried out. In a similar way and with a proper timing, chip shaped carriers 21 are also transferred one-by-one via second conveyor 44 and blue tape support 45 to the die bonder 43.

In all above mentioned process steps, the active surface 28 of chip 21 and particularly the probes 32 thereon are not touched at all, and this ensures that no damage of that active surface can take place during the assembling process. In addition, the above defined process ensures that the quality of the cutting of chip 21 remains basically unchanged.

In a further preferred embodiment, at least the following of the above mentioned assembling steps are carried out in a clean room:

positioning each of said carriers 21 within cavity 18, and melting of the hotmelt 26.

After bonding of a chip 21 to a casing part 14, this casing part and a complementary casing part 15 are forwarded to an automatic packaging apparatus 48, where they are put together to form a complete chip receiving device, that is a cartridge 12 containing a chip shaped carrier 21.

An outstanding advantage of the device and the assembling process according to the invention is that they allow adjustment of the lateral insertion clearance when inserting the chip in cavity 18 of casing part 14. This adjustment possibility eliminates on the one hand the need for a highly accurate positioning of chip 21 for mounting it and the need for relatively large forces for effecting that mounting, and on the other hand allows the use of commercially available standard appliances for the automated manufacture of integrated circuits.

An example of such a standard appliance is e.g. a die bonder which can supply a maximum joining force of 10 Newton. A die bonder is typically used for bonding an electronic silicon chip on a so-called lead frame.

The advantage of such an automated assembly line is that it makes possible to use a mounting machine suitable for use in a clean-room, namely the die bonder, in which the removal of chip 21 from a so-called "blue tape" is already integrated. The minimization of the joining force used for bonding chip 21 and casing part 14 is supported by a video system.

According to the invention a system for carrying out evaluation and/or monitoring methods involving electro-optical reading of an active surface 28 of a chip shaped carrier 21 comprises (a) a cartridge 12 having an opening 13 for introducing a liquid sample into said cartridge 12, (b) a casing part 14 comprised in cartridge 12, which has
  (b.1) an outer surface 16 and inner surface 17,
  (b.2) a first cavity 18 for receiving a chip shaped carrier 21,
  (b.3) means 22 which provide an access to the first cavity 18 and thereby to an active surface 28 of chip shaped carrier 21, wherein
  (b.4) the first cavity 18 has a flat bottom surface 23 and side wall surfaces 24 which extend between said outer surface 16 of said casing part 14 and said bottom surface 23, (c) a hotmelt layer 26 applied to the side walls 24 of the first cavity 18, wherein the inner walls 29 optionally form an obtuse angle with that bottom surface 23 so that the cavity 18 widens with increasing distance from the bottom surface 23, (d) a chip shaped carrier 21 having an active surface 28 which is adapted to be read by an electro-optical reading device, and being positioned in the first cavity 18 of casing part 14, (e) the shape and dimensions of first cavity 18, chip shaped carrier 21, and hot melt 26 being such that a chip shaped carrier 21 fits into the space delimited by said hotmelt layer 26.

In a preferred embodiment, the above described system further comprises electro-optically reading means 51, schematically represented in FIG. 6, for reading the probe array 32 of chip shaped carrier 21. Electro-optical reading means 51 is e.g. a fluorometer, i.e. an apparatus comprising a light source for irradiating active surface 28 with an excitation beam, light detection means for detecting fluorescent light emitted by the probe array 32 on the active surface 28 and providing a corresponding output signal and means for evaluating and/or monitoring that output signal.

Modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the apparatus and the processes described above may be varied without departing from the spirit of the invention and the exclusive use of all modifications which come within the scope of the appended claims is reserved. Possible modifications within the scope of the inventions are as follows:

The chip may be made of other material than glass according to the requirements imposed by the observation and/or analyzing technique of the active surface area of the chip, pressure conditions in use, chemical stability and so on.

Other sealing materials which liquidify when heated may be considered. However, from the present empirical knowledge, a material is preferred, which is essentially solvent free.

Instead of laser light, another energy source may be used, preferably one, the energy of which may be concentrated on the hotmelt material in order not to affect the chip, and in particular the probe array on the active surface. However, the heating, i.e. the energy supply has to be controlled in order to avoid heating the material to an extent that it begins to decompose. Decomposition may not only deteriorate the properties of the sealing material, but also produce reactive, possibly volatile molecules which may attack the DNA probes. The same applies, of course, to the material of the housing, as far as it is exposed to the energy source. Preferably an energy source should be used which is apt to be exactly focused, like a laser, so that a heating of the surrounding casing can be perfectly avoided. In a preferred embodiment ultrasonic waves are used for heating the hotmelt material 26. This energy form has the advantage that the process can be carried out in shorter time.

It is not necessary that the solid hotmelt material 26 perfectly covers the entire surface of the side walls of the cavity 18. Any gaps will then be closed when the hotmelt material liquifies during the bonding process.

The cartridge may be made of another material, preferably a polymeric material, which is inert under the condition of the reaction or reactions to be performed in the analytical cartridge.

Although preferred embodiments of the invention have been described above using specific terms, such description is for illustrative purposes only, and it is to be understood that changes and variations may be made without departing from the spirit or scope of the following claims.

What we claim is:

1. A device for receiving a chip shaped carrier having on one side a first surface which includes an active surface coated with an array of DNA snippets or the like, a second surface on a second side opposite to said first side, and an edge having a peripheral outer surface which extends between said first and said second surface, said active surface being adapted to be read by an electro-optical reading device, said device comprising (a) a cartridge having an opening for introducing a liquid sample into said cartridge, (b) said cartridge having a casing part which has an inner surface and an outer surface, a first cavity for receiving a chip shaped carrier, (c) a layer of a sealing material which is reversibly transformable at least once from a solid state into a fluid state and which is provided in a sufficient amount to establish a liquid-tight bond between the inner surface of side walls of the first cavity and said peripheral outer surface of the edge of the chip shaped carrier when the latter is placed into said first cavity.

2. The chip receiving device according to claim 1, wherein the sealing material liquidifies when heated over a certain temperature.

3. The chip receiving device according to claim 2, wherein the sealing material liquidifies when heated by irradiation of energy.

4. The chip receiving device according to claim 1, wherein the sealing material is chosen such that it does not interfere with the optical observation method performable by an electro-optical reading device.

5. The chip receiving device according to claim 1, wherein said layer of sealing material extends on and over the entire inner periphery of the inner surface of the side walls of the first cavity.

6. The chip receiving device according to claim 1, wherein the sealing material constitutes a limitation of the first cavity tapering towards the bottom of it in order to facilitate inserting the chip shaped carrier into the first cavity.

7. The chip receiving device according to claim 1, wherein the bottom of the first cavity is provided with an opening so that the active surface of a chip placed in the first cavity is accessible for optical examination.

8. An analytical cartridge comprising a chip shaped carrier inserted in the first cavity of a chip receiving device according to claim 1, wherein the sealing material fills the clearance between the walls of the first cavity and the chip.

9. The analytical cartridge according to claim 8, wherein the bond established by the sealing material withstands a pressure of at least 300 mbar, preferably at least 500 mbar, at 20° C. for at least one hour on the chip shaped carrier.

10. The analytical cartridge according to claim 8, wherein the means providing access to an active area of the chip shaped carrier is an opening in the bottom of the first cavity, said opening having an inner end and an outer end, and wherein the periphery of said inner end of said opening surrounds the active surface.

11. A process for assembling a plurality of analytical cartridges according to claim 8 comprising:
 (a) providing a plurality of casing parts to an automated assembly line,
 (b) providing a plurality of chip shaped carriers having each an active surface to said assembly line,
 (c) positioning each of said chip shaped carriers within the first cavity of one of said casing parts by means of a first automatic apparatus,
 (d) bonding each of said chip shaped carriers in said first cavity of said casing part, by liquidifying the sealing material.

12. The process according to claim 11, wherein the liquidifying of the sealing material is performed by irradiating said sealing material with an energy form.

13. The process according to claim 12, wherein the sealing material is irradiated with laser light.

14. The process according to claim 12, wherein the sealing material is irradiated with ultrasonic waves.

15. The process according to claim 11, wherein all assembling steps defined therein are fully automated.

16. The process according to claim 11, wherein the following steps are carried out in a clean room:
 positioning each of said carriers within a first cavity of one of said casing parts, and
 bonding of the carrier to the casing part by liquidifying the sealing material.

17. A system for carrying out evaluation and/or monitoring methods involving electro-optical reading of an active surface of a chip shaped carrier, said system comprising
 (a) a cartridge having an opening for introducing a liquid sample into said cartridge, and a casing part,
  (a.1) said casing part being comprised in the cartridge and having an outer surface and an inner surface, a first cavity for receiving a chip shaped carrier, and means which provide access to a first cavity and thereby to said active surface of said chip shaped carrier, and
  (a.2) said first cavity having a flat bottom surface and side wall surfaces which extend between said outer surface of said casing part and said bottom surface;
 (b) a sealing material being provided in said first cavity, said sealing material consisting of an at least once reversibly liquidifiable material, and
 (c) a chip shaped carrier having an active surface which is adapted to be read by an electro-optical reading device, said chip shaped carrier being positioned in said first cavity of said casing part, and the sealing material filling the gap between the cavity walls, particularly its side walls, and the chip shaped carrier in order to hold the chip shaped carrier firmly and fluid-tightly in the cavity.

18. The system according to claim 17, said system further comprising means for electro-optically reading said active surface of said chip shaped carrier.

* * * * *